United States Patent [19]
Khoury

[11] Patent Number: 5,719,525
[45] Date of Patent: Feb. 17, 1998

[54] ENHANCED VOLTAGE TRACKING CIRCUIT FOR HIGH VOLTAGE TOLERANT BUFFERS

[75] Inventor: Elie Georges Khoury, Gilbert, Ariz.

[73] Assignee: VLSI Technology, Inc., San Jose, Calif.

[21] Appl. No.: 781,129

[22] Filed: Jan. 9, 1997

[51] Int. Cl.$^6$ .................... H03K 19/0175; H03K 19/094
[52] U.S. Cl. .................... 327/562; 327/333; 327/535; 327/537; 327/541
[58] Field of Search .................... 327/534–541, 327/543, 545, 546, 72, 73, 77–81, 87, 562, 333; 330/261, 273, 285; 326/81, 68

[56] References Cited

U.S. PATENT DOCUMENTS

| | | | |
|---|---|---|---|
| 4,439,692 | 3/1984 | Beekmans et al. | 327/537 |
| 5,189,316 | 2/1993 | Murakami et al. | 327/535 |
| 5,202,587 | 4/1993 | McLaury | 327/536 |

Primary Examiner—Timothy P. Callahan
Assistant Examiner—T. T. Lam
Attorney, Agent, or Firm—LaValle D. Ptak

[57] ABSTRACT

A comparator used in an enhanced N-WELL pad voltage tracking circuit for high (5 Volts) voltage-tolerant buffers is designed to eliminate current leakage when the input/output is tristated and is being driven externally by a weak voltage source. This is accomplished by comparing the pad voltage supplied from the external source to a reference voltage that is a predetermined amount (VTP) less than the low internal voltage source (VDD). Thus, switchover for tracking of the N-WELL voltage tracks very closely the voltage VDD, reducing the differential voltage between the N-WELL and the pad on the pull-up driver for the system, thereby keeping the driver off and eliminating leakage current. The reference voltage is generated either by a diode voltage drop or by a weak source follower.

11 Claims, 2 Drawing Sheets

ENHANCED VOLTAGE TRACKING CIRCUIT FOR HIGH VOLTAGE TOLERANT BUFFERS

RELATED APPLICATION

This application is related to U.S. Pat. No. 5,543,733, issued on Aug. 6, 1996.

BACKGROUND

Low voltage integrated circuits are widely used in processors for hand-held and portable electronic products because of low power dissipation. This increases the length of time such devices may be operated between battery charging. Higher voltage integrated circuits, however, continue to be required for performing various functions, such as communicating with user interfaces and the like. Low voltage integrated circuit processors may operate at 3 Volts (3V), while high voltage integrated circuit interface devices typically operate at 5 Volts (5V). In the design of integrated circuit buffer amplifiers and other circuits, it is necessary to provide circuits which employ a combination of 3 Volt circuits and 5 Volt circuits in which the circuits are capable of communicating with one another. The above identified co-pending application is directed to a buffer amplifier designed to accomplish this purpose.

The circuit of the above identified co-pending application is effective as a high voltage tolerant CMOS I/O buffer circuit. The circuit efficiently communicates a low voltage output signal to an external terminal and efficiently communicates a high voltage input signal to a low voltage internal terminal. Under most conditions of operation, this input/output circuit is highly effective. Whenever the device is tristated, however, and also is being driven externally by a weak high voltage source, some leakage currents may be produced, resulting in undesirable power consumption.

It is desirable to provide an efficient I/O circuit capable of interfacing between a low voltage internal circuit and a high voltage external circuit which is not subject to leakage currents in the tristate mode.

SUMMARY OF THE INVENTION

This invention is directed to a low voltage internal input/output (I/O) buffer circuit designed to communicate with a high voltage external circuit. To do this, an I/O circuit communicates an external input signal to an internal signal and converts an internal signal to an external output signal. The I/O buffer circuit has a power supply terminal, and an input terminal coupled to an output terminal via an internal conductor or bus. A pull-up circuit is coupled to the power supply terminal and the conductor. This pull-up circuit includes a PMOS transistor having an N-WELL, where the pull-up circuit is configured selectively to pull up the output signal. A pull-down circuit is coupled to a ground terminal and to the conductor. This pull-down circuit is configured selectively to pull down the output signal.

A comparison and logic control circuit is coupled to the power supply terminal and to the conductor; and this circuit is configured to compare a supply voltage level to the input signal. In addition, the comparison and logic control circuit is configured to generate an affirmative logic signal when the input signal is greater than the supply voltage level and to generate a negative logic signal when the input signal is less than the supply voltage level. An N-WELL control circuit is coupled to the power supply terminal, to the conductor, and to the pull-up circuit, with the N-WELL control circuit being responsive to the logic signal. Whenever the circuit is tristated, leakage current is prevented by supplying a bias voltage to the comparator which is less than VDD by the voltage VTP (the source-to-gate drop of a PMOS transistor in the comparator). This ensures positive switching of the system at VDD when an external driver goes high while the device is tristated, thereby preventing unwanted leakage currents from occurring.

DETAILED DESCRIPTION

Figure 1:
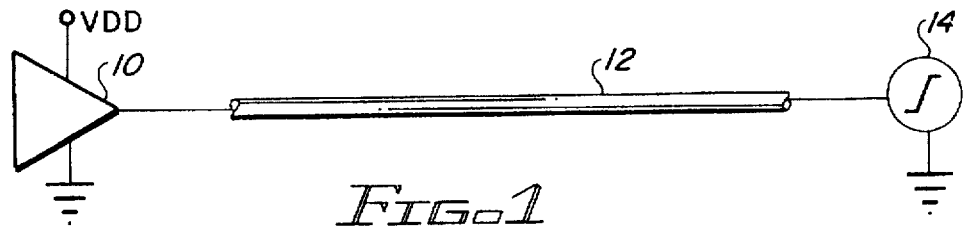
FIG. 1 is a diagrammatic illustration of the system environment in which the invention is used.
Figure 2:
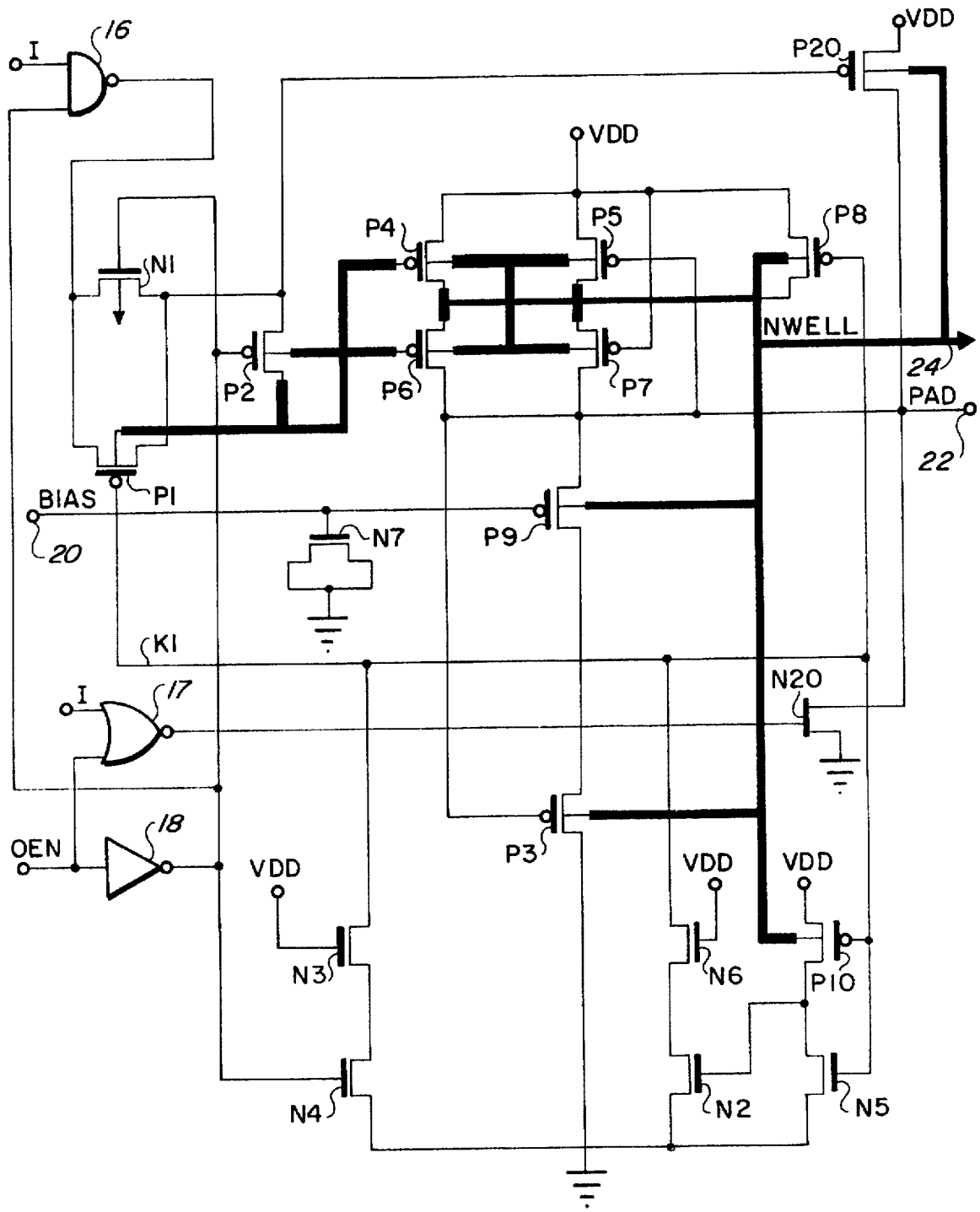
FIG. 2 is a schematic diagram of a preferred embodiment of the invention.
Figure 3:
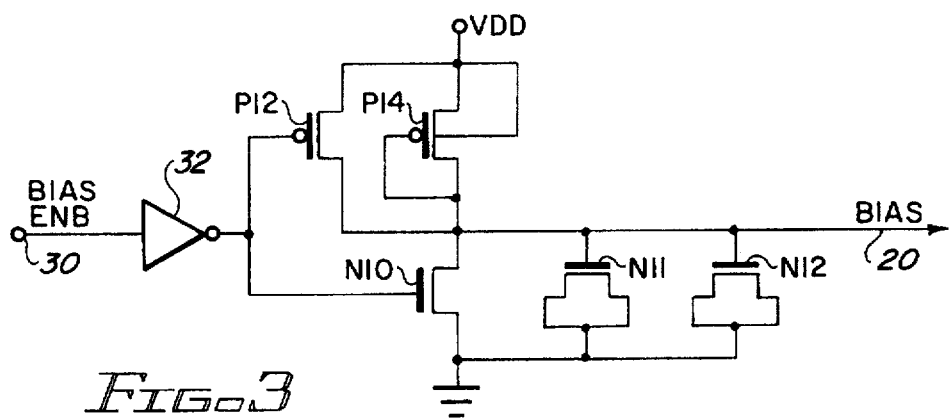
FIG. 3 is a schematic diagram of a circuit used in conjunction with the circuit of FIG. 2.
Figure 4:
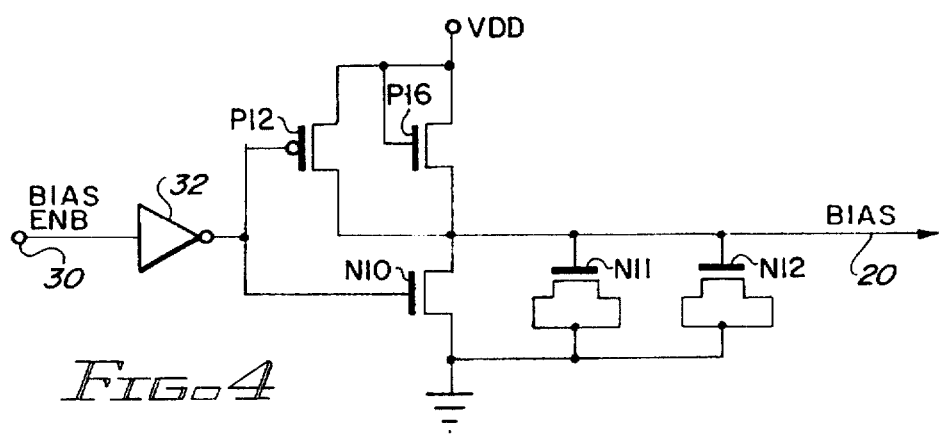
FIG. 4 is an alternative to the circuit shown in FIG. 3.

Reference now should be made to the drawings in which the same reference numbers are used throughout the different figures to designate the same components. FIG. 1 is a diagrammatic representation of the environment in which the circuit of the preferred embodiment of FIGS. 2, 3 and 4 is used. The circuit shown in FIG. 1 illustrates a high voltage (5 Volts) tolerant tristated PCI buffer amplifier 10. This buffer amplifier 10 is connected through a transmission line or interconnection 12 to an external driver 14.

Whenever the power supply (VDD) is disconnected (for instance, a device on an external board without power supply), the internal conditions of the PCI buffer 10 cannot be guaranteed when an external driver 14 goes high. For example, assume the initial conditions of the PCI buffer to be 0 Volts (VDD not connected) and the external driver 14 is at ground level. When the external driver goes high, the N-WELL control circuit brings the N-WELL voltage to the pad voltage of the buffer 10, while the unconnected VDD terminals get charged to a higher voltage. This voltage can be determined by several factors. In the case of a transmission gate type of pre-driver, the unconnected VDD reaches a voltage which is VPAD-VTP, while in a NAND NOR type of pre-driver, it reaches VTP. This high voltage then can be found at the NMOS pull-down device, thus turning on the NMOS driver and shorting the pad to ground.

Even when VDD is connected to a power supply (typically, a low voltage 3 Volt supply), some buffer amplifier circuits 10 tend to track poorly when the bus or transmission line 12 is pulled high by a weak external pull-up device. As a result, leakage current is produced in some cases.

Reference now should be made to FIG. 2 for a description of the overall operation of a PCI buffer amplifier 10 used in conjunction with bias circuits shown in FIGS. 3 and 4 for eliminating leakage currents.

The circuit shown in FIG. 2 is a high voltage tolerant PCI buffer amplifier circuit in which an enhanced N-WELL control circuitry no longer has the bias voltage connected to VDD. The circuit of FIG. 2 essentially has two basic modes of operation, each of which provides control over the N-WELL bias voltage. The first of these modes is considered the active mode (or output mode); and the second is the tristate mode (or input mode).

Whenever the circuit of FIG. 2 is operated in the active mode, the output drive to a pad 22 is enabled. The voltage on the floating N-WELL 24 (shown extending throughout FIG. 2 by means of heavy lines) is set to the internal VDD (typically, 3 Volts). The input sets the output on pad 22 either to high or low; and there is no conflict with external voltage sources on the pad 22, although bus contention is permissible.

To set the N-WELL voltage to VDD (3 Volts in the present example) during the active mode, the following operations occur. The output enable signal (inverted) OENB on terminal 18 is high. This drives the NMOS transistor N-4 on, which in turn causes the control signal voltage on the gate of PMOS transistor P1 to go low since the transistor N3 also is on. This turns on P1. At the same time, the PMOS transistor P8 in the N-WELL control circuit is turned on. This causes the voltage on the N-WELL 24 to go high (VDD or 3 Volts).

In the active mode of operation, the output or voltage on the pad 22 follows the input voltage. But to accomplish this the input pass gate coupled to the output of a NAND gate 16 and consisting of the complementary transistors N1, and P1 must be turned on. This is effected by the output enable inverse signal OENB on the output of an inverter 18 being high. When this occurs, N1 is turned on or rendered conductive, along with N4, as described previously. Since the PMOS transistor P1 is conductive, the voltage on the output of the gate 16 is passed to the gate of PMOS pull-up driver transistor P20. An NMOS pull-down driver transistor N20 is controlled by signals on the output of a NOR gate 17, which receives OEN and input signal "T" at its inputs.

The PMOS transistors P4, P5, P6, P7 and P8 are directed to an N-WELL control circuit of the type employed in the circuit of the above identified co-pending application. This circuit operates in the same manner as described in that application.

When the system shown in FIG. 2 is placed in its tristate mode, the following conditions of operation take place: the output drive is disabled; the external input sets the pad 22 to low or high (VPAD=3 V or 5 V); and the floating N-WELL 24 is set to the greater of the internal VDD (3 V) or the external input voltage VPAD, using a voltage comparator. The voltage comparator basically consists of the PMOS transistors P3 and P9 in conjunction with the NMOS transistors N2, N5, N6 and the PMOS transistor P10.

To set the N-WELL voltage on the terminal 24 to the greater of the internal voltage VDD (3 Volts in the present example) or the external voltage on the pad 22 (as much as 5 Volts), the following conditions apply to the signal applied from the external source (14 of FIG. 1) on the pad 22. Whenever the voltage on the pad 22 is high (5 V) it is greater than VDD (3 Volts). Whenever the voltage on the pad 22 is low (0 V to 3 V for the present example), it is equal to or less than VDD (3 Volts).

In order to determine the N-WELL voltage produced as a result of these input signals, first consider the condition when the signal on the terminal 22 is high (5 Volts). When this occurs, the transistor P7 is on, causing the voltage on the N-WELL 24 to equal the high voltage on the pad 22. At the same time, when OENB from inverter 18 is low (the condition for tristate), the transistor P2 is on, causing the voltage on the gate of transistor P20 to equal the N-WELL voltage on 24 (readily determined by tracing the heavy lined N-WELL connections illustrated in FIG. 2), which in turn is equal to the high (5 V) input signal on the pad 22, thus keeping the transistor P20 off.

For the circuit operation in this condition, the voltage on the output of the NAND gate 16 is at VDD (3 Volts); and the transistor N1 is off. At the same time, the transistor P1 is off; so that the pass gate (transistors N1 and P1) is off. This causes the gate of the transistor P20 (at the high voltage of the pad 22, namely 5V) to be disconnected from the output of the gate 16 (at the VDD voltage 3 V), thereby preventing a short circuit between the pad 22 and VDD.

For the condition where the voltage on the pad 22 (VPAD) is less than VDD−VTP, the transistor P5 is on or conductive transistor P7 is off, and the voltage on the N-WELL 24 is VDD. Whenever the voltage on the pad 22 is high (equal to or greater than VDD+VTP), the transistor P7 is on and the transistor P5 is off. The N-well voltage then is pulled to the pad voltage by transistor P7.

If N-WELL drifting takes place, however, the greater of VDD or VPAD (the voltage on the pad 22) causes either the transistor P4 or P6 to be rendered conductive, which pulls the N-WELL 24 to the greater of VDD or VPAD, the voltage on the pad terminal 22.

In considering the operation of the foregoing circuit, it should be noted that the PMOS transistors P3 and P9 constitute a voltage comparator circuit which receives both the signal VPAD (on pad terminal 22) and VDD (on bias 20) as inputs. The output of this comparator is fed back to an invertor sensor consisting of a PMOS transistor P10 and an NMOS transistor N5. For example when VPAD (the voltage on pad 22) is greater than VDD, the transistor P9 is on, transistor N5 is on, transistor N2 is off, and the voltage on K1 is high and equal to VPAD.

When the voltage VDD is greater than the voltage on VPAD (pad 22), the transistor P3 is on (weak); and the voltage on K1 is low (weak). At the same time, the transistor P10 is on and the transistor N2 is on, which then causes the voltage on K1 to remain low (but strong).

The circuit which has been described thus far is subject to a problem in that the voltage on the pad 22, with the circuit in the tristate mode, does not switch from low to high instantly as the voltage VPAD rises above VDD. The transistor P9, which has its gate coupled to a bias input 20, in the past was biased with VDD applied to the terminal 20. The problem, however, required VPAD to be at VDD+VTP (the threshold voltage drop between the source and gate of the transistor P9) before the transistor P9 was turned on. This caused a delayed switching, which in turn increased the differential voltage between the N-WELL 24 and VPAD (the pad 22) to a small voltage (VTP), thereby weakly turning on the pull-up driver transistor P20. This then acts as a current source device, which prevents the pad 22 from reaching a stable value (5 V) when the pad bus is maintained or driven high externally by a weak resistive device (on the order of 1.5K Ohms).

In order for the N-well to turn high for VPAD greater than VDD, the gate bias of the transistor P9 must be lowered by the voltage VTP from VDD. This is accomplished by using either a simple diode drop circuit or a source follower circuit in the production of the bias signal applied to the terminal 20, as illustrated in FIGS. 3 and 4, respectively.

Reference now should be made to the circuit shown in FIG. 3. Here, a bias enabling signal is applied to the terminal 30 and through an invertor 32 to the gates of a PMOS transistor P12 and an NMOS transistor N10. The bias output terminal 20 is coupled to the drain of the transistor P12 and the source of the transistor N10, with the source of the transistor N10 also being coupled to VDD through a diode constructed from a PMOS transistor P14. A pair of NMOS transistors N11 and N12 function as distributed capacitors for the signal applied on the bias output 20.

As is readily apparent from an examination of FIG. 3, the signal applied on the bias output lead 20 is VDD–VTP or VDD minus the diode voltage drop across the PMOS diode 14, which approximates VTP. It should be noted that the transistor P14 is a small diode and N10 is a very weak device, constituting a very large resistor. Consequently, the current flowing through N10 is quite small, on the order of 1 Microamp to 4 Microamps. When this change in the bias on the gate of the comparator transistor P9 is employed, however, the problem of delayed switching noted above is eliminated; so that the transistor P3 is fully turned off whenever the voltage on the pad 22 switches from low to high. This eliminates the leakage current through the transistor P20 and permits the buffer amplifier to properly function under all conditions of operation.

An alternative to the diode drop bias of FIG. 3 is to employ a source follower bias of the type shown in FIG. 4. Either the circuit of FIG. 3 or FIG. 4 may be employed to produce the proper bias voltage level on the gate of the transistor P9. The components of the circuit of FIG. 4, which are the same as the circuit of FIG. 3, are provided with the same reference numbers. In place of a diode P14, however, a source follower NMOS transistor N16 is coupled between the source of the transistor N10 and the voltage supply VDD. The source follower of FIG. 4 also is connected in series with a very weak (long channel and minimum width) NMOS transistor N10 to draw as little as 1 Microamp and no more than 4 Microamps of current. The distributed capacitors N11 and N12 assist in stabilizing the bias voltage. The drop in voltage which is produced by the circuit of FIG. 4 also is approximately VTP; so that the bias voltage on the terminal 20 is VDD–VTP, as described above in conjunction with FIG. 3.

Figure 5:
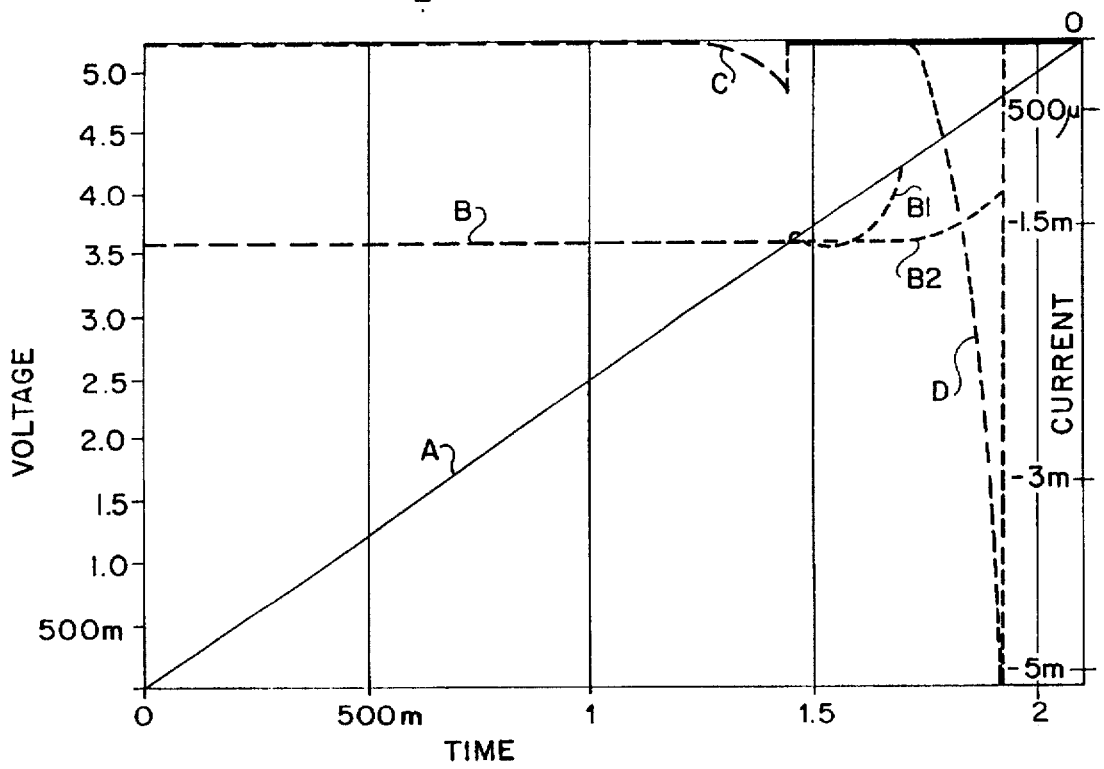
FIG. 5 shows waveforms illustrating the operation of the circuit of FIG. 2.

Reference now should be made to FIG. 5, which illustrates the differences in the pad currents which exist in the circuit of FIG. 2 when a bias voltage of VDD is applied to the terminal 20 and when bias voltages of VDD–VTP resulting from the bias circuits of FIGS. 3 and 4 are employed in conjunction with the circuit of FIG. 2. In FIG. 5, the line "A" represents a linear progression in the increase of pad voltage, for the circuit of FIG. 2 operated in a tristate mode, from 0 Volts to 5 Volts over a period of time. The voltage scale is shown on the left-hand side of FIG. 5; and the time scale is across the bottom. As the pad voltage increases, the N-WELL voltage "B" is illustrated; and, with a bias voltage of VDD applied to terminal 20 of FIG. 2 in accordance with the prior art, the N-WELL voltage extends along the line B2, as shown on the right-hand side of FIG. 5.

The pad current or leakage current, however, which has been described above as a result of delayed switching, resulting from a bias voltage of VDD applied to the terminal 20, is shown in waveform "D" of FIG. 5, which has the current scale shown on the right-hand side. As is readily apparent, a substantial leakage current exists, which in some cases renders the circuit of FIG. 2 unacceptable because of the power drain resulting from this leakage current. This is particularly true when the circuit is used with portable, battery powered equipment. As shown in FIG. 5, however, when the bias voltage applied to the terminal 20 is VDD–VTP (as provided by the bias generator circuits of either FIG. 3 or FIG. 4), the N-WELL voltage extends along the curve B/B1 and the pad current is illustrated by waveform "C". The circuit produced by the combination of FIG. 2 with either of FIGS. 3 or 4 thereby clearly reduces the current sinking to zero.

The foregoing description of the preferred embodiment of the invention is to be considered as illustrative and not as limiting. For example, other techniques may be used besides the ones shown in FIGS. 3 and 4 for generating the proper bias voltage for application to the bias terminal 20. Various other changes will occur to those skilled in the art for performing substantially the same function, in substantially the same way, to achieve substantially the same result without departing from the true scope of the invention as defined in the appended claims.

What is claimed is:

1. A bias circuit for a CMOS comparator used in a high voltage tolerance input/output circuit including in combination:

a first terminal for connection with a source of variable input voltage;

a second terminal;

a comparator including first and second CMOS transistors, each transistor having source, drain and gate electrodes, with the source electrode of said first CMOS transistor connected to said first terminal, said drain electrode of said first CMOS transistor connected to said source electrode of said second CMOS transistor, and said drain electrode of said second CMOS transistor connected to said second terminal, said comparator switching from one state to another state in response to input voltages on said first terminal;

a reference voltage source;

a bias circuit comprising a voltage drop device and a high impedance resistor element connected together at a junction in series circuit, in the order named, between said reference voltage source and said second terminal; and a connection between the gate of said first CMOS transistor and said junction, and a connection between the gate of said second CMOS transistor and said first terminal.

2. The combination according to claim 1 wherein said voltage drop device comprises a source follower.

3. The combination according to claim 2 wherein said source follower is a NMOS source follower and said resistor element is a weak NMOS device fabricated with a very long channel and minimum width.

4. The combination according to claim 3 wherein said second terminal is a ground terminal.

5. The combination according to claim 4 wherein said reference voltage source is a voltage VDD and said source of variable input voltage varies from a voltage less than VDD to a voltage greater than VDD.

6. The combination according to claim 1 wherein said voltage drop device comprises a diode device.

7. The combination according to claim 6 wherein said diode device is fabricated from a relatively small PMOS device and said resistor element is a weak NMOS device fabricated with a very long channel and minimum width.

8. The combination according to claim 7 wherein said second terminal is a ground terminal.

9. The combination according to claim 8 wherein said reference voltage source is a voltage VDD and said source of variable input voltage varies from a voltage less than VDD to a voltage greater than VDD.

10. The combination according to claim 1 wherein said second terminal is a ground terminal.

11. The combination according to claim 1 wherein said reference voltage source is a voltage VDD and said source of variable input voltage varies from a voltage less than VDD to a voltage greater than VDD.

* * * * *